AMPLIFIER BAND WIDTH CONTROL

Filed July 5, 1947

INVENTOR.
GEORGE C. SZIKLAI
BY Samuel B. Smith
ATTORNEY

Patented Dec. 18, 1951

2,579,345

UNITED STATES PATENT OFFICE 2,579,345

AMPLIFIER BAND WIDTH CONTROL

George C. Sziklai, Princeton, N. J., assignor to Radio Corporation of America, a corporation of Delaware Application July 5, 1947, Serial No. 759,280

9 Claims. (Cl. 179—171)

This invention relates to cascade amplifiers and more particularly to control of pass band width for improvement in signal to noise ratios.

Recent developments in the electronic art have caused an increased demand for signal amplifiers with greater frequency band width handling ability. It is therefore necessary to employ vacuum tubes and associated circuits in such a manner as to realize their greatest efficiency.

It has been generally accepted that the maximum uniform amplification that can be secured in one tube may be expressed by the equation $$A=\frac{g_m}{\pi f_w\sqrt{C_g C_p}}$$

wherein $A$ is the voltage ratio between input and output circuits of equal impedance, $g_m$ is the transconductance of the tube, $C_g$ and $C_p$ are the grid and plate capacitance of the tube, and $f_w$ is the width of the frequency band.

We may gather from the above equation that with any given tube and circuit arrangements, the gain is inversely proportional to the width of the frequency band.

It is important, however, that consideration be given to noise factor when wide band amplifiers are employed. This is particularly true when low level signals are handled, such, for example, as might be expected in the reception of signals transmitted from a distant transmitter.

Although there are a number of different sources of noise in a radio receiver, noise originating in the radio receiver itself is of considerable importance in wide band receivers.

In most television receivers, the major source of noise is the heterodyne mixer or first detector, since it has only about ⅓ gain that an amplifier will develop with approximately the same plate current. In television receivers, due to the large band width required, this gain is limited to very low values, therefore the noise of the first intermediate frequency amplifier contributes considerably to the total noise found in the television receiver.

The total root-mean-square mixer-grid-noise input equivalent of the receiver due to shot noise may be calculated from the equation $$\sqrt{\overline{eg_m{}^2}}=1.3\times10^{-10}\sqrt{\frac{\Delta f}{s_m}}+12.5\times10^{-10}\frac{\Delta f_{cm}}{s_m}\sqrt{\frac{\Delta f}{g_m i-f}}$$

where $\Delta f$ is the band width, $s_m$ is the conversion transconductance of the mixer, $c_m$ is the average of the mixer and first I.-F. input capacitance, and $g_m$ I.-F. is the mutual conductance of the first I.-F. amplifier tube.

Assuming a band width, for example, of 5 mc., a conversion transconductance of 1000 micromhos, a mean capacitance of 20 μμf, and a first I.-F. amplifier transconductance of 5000 micromhos, the noise is approximately 13 microvolts.

If the band width is reduced to 2 mc. the noise is reduced to 7 microvolts. If there is adequate signal available, this improvement is not significant, but at locations where the available signal strength is only slightly greater than 13 microvolts, fine image detail is destroyed by the noise, and the entertainment value of the image is generally impaired.

By reducing the band width in the coupling circuit between the mixer and the first I.-F. amplification stage and thereby increasing the mixer gain, the noise is almost halved, and while the fine detail is missing as a result of the narrow pass band transmitted, the general image quality is substantially improved.

According to this invention, provision is made for reducing the pass band and simultaneously increasing the overall gain upon the reception of low signal strength.

A primary object of this invention is to obtain maximum performance from wide band amplifier circuits.

Another object of this invention is to provide for improvement in signal to noise ratio of low level signals.

Still another object of this invention is the reduction of apparent noise in the television image at the expense of detail which would be destroyed anyway by noise interference.

Other and incidental objects of the invention will be apparent to those skilled in the art from a reading of the following specification and an inspection of the accompanying drawing in which Figure 1 illustrates schematically one form of this invention as it relates to television circuits and the like;

Figures 1, 2, 3, 4, 5:
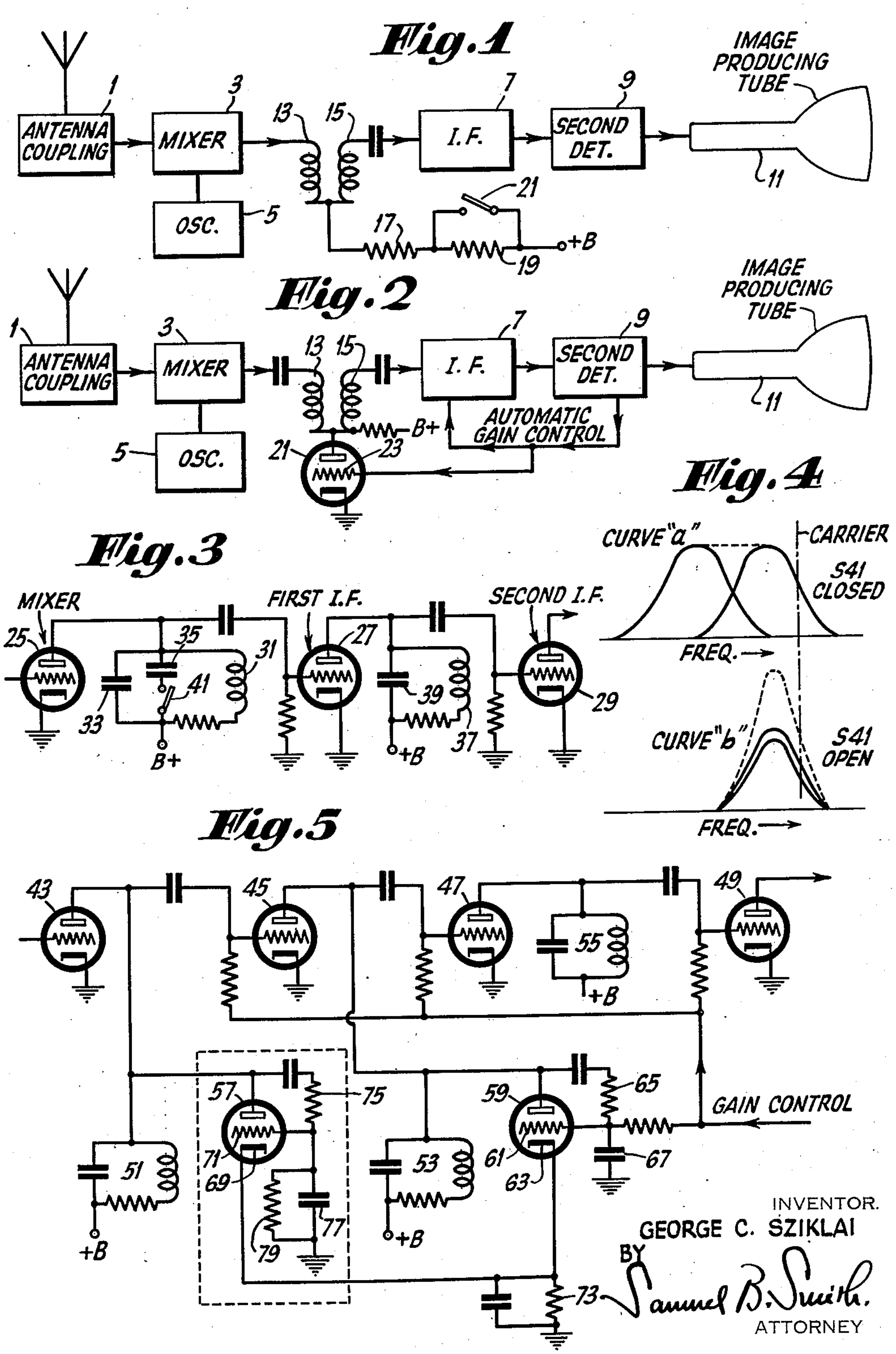
Figure 2 shows another form of this invention involving automatic control.
Figure 3 illustrates by circuit diagram still another form of this invention.
Figure 4 illustrates graphically the operation of one form of this invention.
Figure 5 shows by circuit diagram still another form of this invention involving automatic control.

Turning now in more detail to Figure 1, there is illustrated in block an antenna coupling device 1, a mixer circuit 3 and an associated oscillator 5.

The antenna coupling device 1, the mixer 3 and the oscillator 5 may take any of the well known forms commonly illustrated in circuit diagrams of various types of radio receivers involving two detectors. It will be remembered, however, that the usefulness of this invention is particularly directed to those systems involving the transmission of wide band signals, and it is therefore desirable that antenna coupling device 1, mixer 3 and oscillator 5 be of the type for the conversion of extremely high frequency signals involving relatively wide bands of frequencies.

Although it is not intended that the employment of this invention be limited to use in television receivers, a typical circuit diagram illustrative of the type of system to which this invention is particularly applicable is presently marketed and is described in the "RCA Review" for March 1947.

The intermediate frequency amplifier shown in block 7 provides a second detector 9 with video and synchronizing signals. The second detector then furnishes the necessary video signals to the image producing tube 11 in a manner well known to the art.

The signals obtained from the mixer 3 are coupled to the intermediate frequency amplifier 7 by a coupling arrangement involving a transformer having primary coil 13 and secondary coil 15. The width of the pass band transmitted through the coupling circuit involving coils 13 and 15 is dependent upon the amount of mutual resistance contained in the circuit connecting the coils 13 and 15 to a point of fixed potential which, according to the diagram illustrated in Figure 1, is the source of anode potential B+. The gain of the mixer 3 varies inversely as its load impedance.

A resistance element 17 is connected in series with a second resistance element 19 which has connected in parallel therewith a switch 21. The purpose of this switch 21 is to increase the effective resistance between a point of fixed potential such as B+ and the coupling transformer involving the coils 13 and 15.

When switch 21 is in a closed position, there is less resistance in the circuit, and the pass band transmitted between coils 13 and 21 has a predetermined minimum of width, and the gain of mixer 3 is greater. However, when switch 21 is open, resistor 19 is also included in the circuit to cause the coupling transformer containing coils 13 and 15 to have a less peaked characteristic in such a manner as to pass more uniformly a wider band of frequency with a lower gain in mixer 3.

It will be seen, therefore, that upon the reception of weak or distant signals, switch 21 may be closed in order that the effect of noise on the reproduced image will be reduced, and although the detail of the image produced will suffer insofar as high frequency components are concerned, the overall entertainment value of the image reproduction will be increased.

Turning now to Figure 2, there is illustrated another form of this invention involving components similar to that employed in the form of the invention shown in Figure 1, and wherein like components have the same numerals.

In the form of the invention shown in Figure 2, an antenna coupling circuit 1 provides mixer 3 with the necessary signal energy. Oscillator 5 provides the required beat note to form in mixer 3 an intermediate frequency which is transmitted to intermediate frequency amplifier 7 through a coupling circuit involving a transformer having coils 13 and 15.

There is, however, substituted for resistance elements 17 and 19 of the form of the invention shown in Figure 1 a variable reactance device such as a thermionic tube 21, whose internal impedance may be varied by controlling the bias potential of its control electrode 23. The bias potential of control electrode 23 may be controlled manually, or it may be obtained through the automatic gain control circuit whose energy is derived from second detector 9 of Figure 2, in accordance with the incoming signal strength. In its normal function, the automatic gain control signal or energy is employed to control the gain of the intermediate frequency amplifier 7. Such action is normal procedure in radio receivers, and the control voltage may be obtained from the video second detector or from the associated audio channel second detector, as is done in the commercially marketed receiver shown and described in the "RCA Review" for March 1947, referred to above.

By so polarizing the potential obtained from the automatic gain control circuit that the impedance of tube 21 is increased upon an increase in signal strength arriving at the receiver, an automatic compensation of band pass transmission and a gain control of the mixer 3 may be obtained in such a manner that maximum utilization of available signal energy will be obtained.

For example, if the incoming signal is weak and normally the effect of the noise obtained from all sources would be great, the coupling circuit involving the transformer having coils 13 and 15 is narrowed in frequency response characteristic in such a manner as to reduce the effect of the relatively high level noise on the reproduced image. A further improvement is obtained by increasing the gain of mixer 3 by lowering its load resistance. When, however, on the other hand, the incoming signal is of high relative field strength, the control voltage obtained from the automatic gain control circuit will increase the impedance of tube 21, and hence the frequency band response of the coupling circuit involving coils 13 and 15 will be increased in such a manner that a maximum band width will be transmitted to the intermediate frequency amplifier 7. This action is accomplished in view of the fact that upon reception of a signal having a high field strength, the normal action of an automatic gain control is to provide a negative bias signal to the grids of the tubes of the intermediate frequency amplifier 7 in order to reduce the gain of the intermediate frequency amplifier 7. This increased negative bias, when applied to control electrode 23 of tube 21, will increase the impedance of tube 21. This increased impedance will broaden the response of the coupling circuit involving coils 13 and 15. On the other hand, upon the reception of a weak signal, the automatic gain control circuit will provide a less negative bias to the intermediate frequency amplifier 7. This less negative bias upon the control electrode 23 will cause a decreased impedance in tube 21 with a corresponding narrowing of the frequency response of the coupling circuit involving coils 13 and 15.

Turning now to Figure 3, there is illustrated still another form of this invention wherein there is involved a tube 25 which may, for example, be a mixer tube in a radio receiver having two detectors. Tube 27 and tube 29 are, for example, intermediate frequency amplifiers. A resonant coupling circuit involving inductance 31, capacity 33 and capacity 35 provides a resonant circuit coupling between tubes 25 and 27. A second resonant coupling circuit having inductance 37 and capacitor 39 provides coupling between tubes 27 and 29. Circuit constants in the coupling circuits referred to are so chosen that the natural resonant frequency of the coupling circuit involving condensers 33 and 35 is the same as the natural resonant frequency of the coupling circuit involving condenser 39 when switch 41 is in one of its positions, such as, for example, in an open position. When, however, the switch 41 is in a closed position, the frequency of the first coupling circuit is lower by a predetermined amount than the resonant frequency of the second coupling circuit.

It will be seen, therefore, that by opening the switch 41 upon the reception of weak signals, a narrower pass band will be transmitted and therefore an improved overall performance of the system will be had with respect to the effect of noise on reproduction. When, however, the incoming signal strength is great enough that little or no difficulty results from the accompanying noise signal, switch 41 may be closed to cause a stagger tuning of the cascade amplifier. The operation of the form of the invention shown in Figure 3 may best be described further by a brief reference to Figure 4, wherein the response of the two coupling circuits is illustrated when the switch 41 is opened and closed. For example, in curve "*a*" the solid lines illustrate the different response characteristics of the two coupling circuits. The overall response characteristic is illustrated by the dotted line. Curve "*a*" illustrates a relatively wide pass band with respect to curve "*b*," illustrating by the solid lines both coupling circuits being tuned to the same frequency. The overall response is shown by the dotted line. In the case of curve "*b*," the dotted line illustrates a sharper or a narrower overall band.

It will be seen that the practice of this invention is particularly applicable to systems employing single or vestigial side band. In Figure 4, the carrier frequency is indicated at the edge of the pass band in both curve "*a*" and curve "*b*." It follows that, by adjusting the frequency of the resonant circuit including inductance 37 and capacity 39 at the end of the channel adjacent the carrier frequency, the channel may be narrowed without disturbing the response of the pass band at carrier frequency.

Vestigial side band operation has become quite popular in the transmission of information requiring broad frequency bands by reason of the fact that the double side band system is a wasteful system of transmission of signal energy since the signal components in the two side bands contain identical information. If only one side band is transmitted, however, maximum use is made of the channel width in the transmission of image detail.

Additional information on single side band transmission may be found in an article by L. S. Nergaard entitled "A Theoretical Analysis of Single Side-Band Operation of Television Transmitters," in the "Proceedings of the Institute of Radio Engineers," for October, 1939.

Turning now to Figure 5, there is shown a cascade amplifier involving four amplifier tubes 43, 45, 47 and 49. Tubes 43 and 45 are coupled with a resonant coupling circuit 51. Tubes 45 and 47 are coupled with a resonant coupling circuit 53, and tubes 47 and 49 are coupled with a resonant coupling circuit 55. Coupling circuit 51 has connected in parallel therewith a reactance device such as tube 57, likewise coupling circuit 53 has a reactance tube 59 coupled in parallel therewith.

If, for example, the resonant frequency of coupling circuit 53 is different from the resonant frequency of coupling circuit 55, normally the combinations of tubes 45 and 47 will transmit a relatively wide frequency band, due to staggered tuning of their coupling circuits. However, if a variable reactance device 59 is connected in parallel with coupling circuit 53 in such a manner as to change its frequency to correspond with the natural frequency of coupling circuit 55, narrower pass band will be transmitted. Such action may be understood after a brief reference to popular automatic frequency control circuits in which a variable impedance is connected in parallel with a resonant circuit to change its resonant frequency in accordance with a predetermined change in impedance of the associated reactance device.

The popular automatic frequency control systems are composed basically of two parts. First, there is a part known as the discriminator, which develops a direct current voltage proportional to the extent that a frequency differs from a desired value. This voltage is employed to control a reactance tube which is arranged to draw a reactive current having a value dependent upon the control voltage developed by the discriminator portion of the circuit. The reactance tube is shunted across a tuned circuit, and the system is so arranged that when the natural frequency of the tuned circuit does not have the desired value, there results a control action on the reactance tube that shifts the frequency of the tuned circuit so that it will correspond to the desired frequency value.

The variable reactance device employed in the circuit diagram shown in Figure 5 is tube 59, in which the plate cathode circuit is in shunt with the resonant circuit 53, and the control grid 61 varies in potential with respect to the associated cathode 63, not only in respect to the gain control voltage but also with an exciting voltage derived from the alternating voltage existing across its associated resonant circuit 53 by 90° difference. The signal energy which is 90° out of phase with the signal in the resonant circuit 53 is obtained through a resistor-condenser combination comprising resistor 65 and condenser 67.

Automatic frequency control has been well described in the art, and a detailed explanation thereof may be found, for example, in the article by D. E. Foster and S. W. Seeley, entitled, "Automatic Tuning, Simplified Circuits, and Design Practice," published in the "Proceedings of the Institute of Radio Engineers," for March 1937, and in the U. S. patent to Baker et al., No. 2,374,265, issued April 24, 1945.

In such an arrangement, the amplified grid voltage acting in the plate circuit draws an alternating plate current that is 90° out of phase with the voltage across the resonant circuit 53. The tube 59 then acts as a shunting inductive reactance having a magnitude depending upon the amplification of the tube and hence upon the bias developed in the automatic gain control system.

The numerical value of the reactance is $$\text{Reactance of plate cathode circuit} = \frac{E}{I} = \frac{1}{kg_m}$$

wherein $g_m$ is the transconductance of the tube,
$k$ is the absolute value of the ratio of alternating grid voltage to alternating plate-cathode voltage, and
EI is the alternating current drawn by the tube.

For proper operation, it is desirable that phase difference between the plate-cathode and the control-grid voltages be exactly 90°, otherwise the tube will draw a resistance component of current and so shunt across the resonant circuit 53 as to form a positive or negative resistance having a magnitude that will depend on the automatic gain control voltage. Such a resistance causes the amplitude of the transmitted signal to depend upon the gain control voltage rather than the resonant frequency of resonant circuit 53.

The operation of the control circuit may be outlined as follows.

If, for example, the incoming signal is of sufficiently high amplitude that no trouble is experienced with associated noise, it will then be desirable to obtain a full band width reception. Upon a high incoming signal strength, the automatic gain control voltage normally reaches a high negative value. Upon applying a high negative value potential to control electrode 61 of tube 59, the mutual conductance of tube 59 will decrease. The decreased mutual conductance will raise the inductive reactance of the plate cathode circuit of tube 59 according to the relation $$X_L = \frac{1}{kg_m}$$

wherein $g_m$ is the transconductance of the tube and
$k$ is the absolute value of the ratio of alternating grid voltage to alternating plate-cathode voltage.

Upon an increase in inductive reactance of tube 59, the apparent inductance across the resonant circuit 53 will increase, thus decreasing the resonant frequency in accordance with the formula $$f = \frac{1}{2\pi\sqrt{LC}}$$

The lowering of the frequency of the resonant circuit 53 will widen the pass band without affecting the upper limit which is determined by the resonant circuit 55.

If a weak signal is received, the control voltage will be less negative, therefore the mutual conductance of tube 59 will be greater, thus reducing the inductive reactance and therefore the apparent inductance. The lowering of the apparent inductance increases the resonant frequency of resonant circuit 53, making it overlap to a greater extent the pass band of resonant circuit 55, thereby providing a higher overall gain with a narrower band.

For the amplification of the single or vestigial side band signal, it is desirable that the coupling circuit having a frequency response adjacent the carrier frequency be left without change, and that the coupling circuit having a remote resonant frequency be changed or drawn closer to the carrier frequency in order to provide for a narrower and more peaked transmission band. In the case of cascaded amplifiers having a large number of stages and adapted to the transmission of single or vestigial side band amplification, it is desirable that all frequency changes be made in the same direction, that being toward the carrier frequency. A plurality of reactance tubes, such as tube 59, may therefore be provided for a multiplicity of amplifier tubes such as 45 and 47.

However, if double side band amplification is desired, it is necessary to narrow the pass band equally on both sides of the carrier frequency. This may be provided in accordance with this invention by tube 57, which may be similar in characteristics to tube 59 and connected as a reactance device across resonant circuit 51.

It is necessary, however, in the case of reactance tube 57 that its operation be in reciprocal to that of reactance device 59. Such control may, for example, be obtained by connecting the cathodes of tubes 57 and 59 together in such a manner that the potential of cathode 69 with respect to its associated control electrode 71 will be inverse to that of the cathode 63 with respect to its associated control electrode 61. This is accomplished through cathode follower resistance 73. The necessary 90° phase difference in control electrode potential with respect to the resonant circuit 51 is obtained with the employment of resistor 75 and condenser 77 in the manner described heretofore in connection with the reactance tube 59. A grid-leak resistor 79 is employed to allow the charges to leak off from the control electrode 71.

The operation of the total control circuit involving both reactance tubes 57 and 59 may be outlined as follows. When the incoming signal is of sufficiently high amplitude that no trouble is experienced with accompanying noise, the full band width reception is obtained as follows: Upon a strong signal, the automatic gain control voltage reaches a high negative value. The high negative value of control voltage is applied to control electrode 61 of tube 59, causing the mutual conductance of tube 59 to decrease. The decreased mutual conductance will raise the inductive reactance of the plate cathode circuit of tube 59. Upon an increase in inductive reactance of tube 59, the apparent inductance across the resonant circuit 53 will increase, thus decreasing the resonant frequency. The lowering of the frequency of resonant circuit 53 will widen the pass band without affecting the center of the pass band which is determined by resonant circuit 55.

The high negative control voltage will cause control electrode 63 of tube 59 to go negative, thus cathode 69 of tube 57 will go negative with respect to its associated control electrode 71, causing the mutual conductance of tube 57 to be greater, thus reducing the inductive reactance of tube 57 and therefore the apparent inductance of tube 57. The lowering of the apparent inductance of tube 57 increases the resonant frequency of resonant circuit 51 to a frequency above the resonant frequency of resonant circuit 55. Circuit constants can be selected to provide, for example, for a frequency shift equal in both resonant circuit 51 and resonant circuit 53 so that the overall pass band will be expanded equally on both sides of the resonant frequency of resonant circuit 55.

On the other hand, if a weak signal is received, the control voltage will be less negative, therefore the mutual conductance of tube 59 will be greater and the mutual conductance of tube 57 will be less. This action will reduce the inductive reactance of tube 59 and increase the inductive reactance of tube 57. The lowering of apparent inductance of tube 59 increases the resonant frequency of resonant circuit 53. The increasing of the apparent inductance of tube 57 will increase the resonant frequency of resonant circuit 51. If circuit constants are properly selected, such action of the gain control signal may be made to equalize the resonant frequencies of all three resonant circuits 51, 53 and 55 to obtain a higher overall gain of the system with a narrower transmission band.

Having thus described the invention, what is claimed is:

1. In a cascade amplifier, a plurality of peaked frequency coupling circuits, each of which couples different tubes and each of whose resonant frequencies are normally displaced from each other, an associated gain control circuit for said amplifier, and variable reactance devices connected in frequency determining relation to said coupling circuits and means for controlling said variable reactance device by said associated gain control circuit such to decrease the resonant frequency difference of said coupling circuits upon an increase in overall gain of said amplifier.

2. In a television receiver, an intermediate frequency amplifier having a plurality of coupling circuits, at least some of which have different resonant frequency response values, an automatic gain control for said intermediate frequency amplifier, a variable reactance device connected to at least one of said coupling circuits in such a manner as to change the frequency response values thereof, and a connection between said variable reactance device and said automatic gain control circuit such to reduce the difference in the frequency response of said coupling circuits upon an increase of gain of said intermediate frequency amplifier.

3. In a frequency band pass circuit, a plurality of signal networks each nominally tuned to different mean frequencies spaced within the band pass of the circuit, a signal translating device connected for tunably isolating but coupling energy from the output of one network to the input of an adjacent network, means connected with said band pass circuit responsive to the amplitude of signal passing therethrough to develop a unidirectional control potential, means connected with at least one of said signal networks for changing the mean frequency thereof in accordance with an applied control potential, and connections for applying said unidirectional control potential to said frequency changing means with such electrical sense to compress the spacing of said signal network mean frequencies during the passing of low amplitude signals.

4. In a frequency band pass circuit, a plurality of signal networks each nominally tuned to different mean frequencies spaced within a band pass of the circuit, at least one variable gain signal translating device connected for tunably isolating but coupling energy from the output of one network to the input of an adjacent network, a gain control circuit for altering the gain of said band pass circuit by altering a control potential applied to at least one of said signal translating devices, means connected with at least one of said signal networks for changing the mean frequency thereof in accordance with an applied control potential, and means connected with both the control potential of said gain control circuit and said frequency changing means for controlling the frequency band pass of said band pass circuit in accordance with changes of gain in said circuit.

5. Apparatus according to claim 4 wherein said gain control circuit is of the automatic variety adapted to maintain the output amplitude of said band pass circuit substantially constant.

6. In a staggered tuned band pass amplifier comprising in combination, a plurality of discharge device signal amplifiers coupled with each other by parallel inductance-capacitance type resonant circuits, each resonant circuit being nominally tuned to a different frequency discretely positioned within the desired band pass of said amplifier, a variable reactance device responsive to an applied control voltage for determining the reactance value thereof, connections for placing said reactance device in shunt with at least a portion of one of said resonant circuits such to control the resonant frequency thereof, a gain control circuit connected with at least one of said signal amplifiers for controlling the gain thereof in accordance with a gain control potential, and connections for coupling variations in said gain control potential to said reactance device for control thereof.

7. Apparatus according to claim 6 wherein said gain control circuit is of the automatic type adapted to maintain the output amplitude of said band pass amplifier substantially constant over large variations in amplifier input signal level.

8. Apparatus according to claim 6 wherein there is additionally provided another variable reactance device connected in shunt with at least a portion of another resonant circuit in said band pass amplifier for control by said gain control circuit and wherein the gain control circuit control potential is applied to each of said reactance devices in an opposite electrical sense such that for a given increase in gain control potential one resonant circuit resonant frequency is increased while the other resonant circuit resonant frequency is decreased.

9. Apparatus according to claim 6 wherein the electrical sense of said reactance device control is established such to increase the range of resonant frequencies embraced by said resonant circuits for an increase in received signal strength.

GEORGE C. SZIKLAI.

REFERENCES CITED

The following references are of record in the file of this patent:

UNITED STATES PATENTS

| Number | Name | Date |
|---|---|---|
| 1,945,096 | Tellegen | Jan. 30, 1934 |
| 2,120,998 | Barber | June 21, 1938 |
| 2,136,664 | Barber | Nov. 15, 1938 |
| 2,169,830 | Case | Aug. 15, 1939 |
| 2,216,160 | Curtis | Oct. 1, 1940 |
| 2,255,690 | Wheeler | Sept. 9, 1941 |
| 2,262,707 | Farrington | Nov. 11, 1941 |